United States Patent
Lee et al.

(10) Patent No.: US 11,956,904 B2
(45) Date of Patent: Apr. 9, 2024

(54) MULTILAYER CIRCUIT BOARD AND MANUFACTURING METHOD THEREFOR

(71) Applicant: STEMCO CO., LTD., Cheongju-si (KR)

(72) Inventors: Jae Soo Lee, Cheongju-Si (KR); Hyo Jin Park, Sejong-Si (KR); Sung Jin Lee, Cheongju-Si (KR); Dong Gon Kim, Cheongju-Si (KR)

(73) Assignee: STEMCO CO., LTD., Cheongju-si (KR)

( * ) Notice: Subject to any disclaimer, the term of this patent is extended or adjusted under 35 U.S.C. 154(b) by 0 days.

(21) Appl. No.: 16/952,021

(22) Filed: Nov. 18, 2020

(65) Prior Publication Data

US 2021/0076507 A1 Mar. 11, 2021

Related U.S. Application Data

(63) Continuation of application No. PCT/KR2019/008818, filed on Jul. 17, 2019.

(30) Foreign Application Priority Data

Jul. 19, 2018 (KR) .................. 10-2018-0083891

(51) Int. Cl.
*H05K 1/02* (2006.01)
*H05K 3/46* (2006.01)

(52) U.S. Cl.
CPC ......... *H05K 3/4602* (2013.01); *H05K 1/0298* (2013.01); *H05K 3/4655* (2013.01); *H05K 2201/0959* (2013.01); *H05K 2203/13* (2013.01)

(58) Field of Classification Search
CPC .. H05K 3/4602; H05K 1/0298; H05K 3/4655; H05K 2201/0959; H05K 2203/13;
(Continued)

(56) References Cited

U.S. PATENT DOCUMENTS 6,252,176 B1 * 6/2001 Kuramochi ............ H05K 1/024
174/262
8,263,871 B2 * 9/2012 Asami .................. H05K 1/0203
257/713

(Continued)

FOREIGN PATENT DOCUMENTS

JP         S54-7171 A     1/1979
JP        11-145621 A     5/1999

(Continued)

OTHER PUBLICATIONS

An Office Action; "Notice of Reasons for Refusal," mailed by the Japanese Patent Office dated Jan. 4, 2022, which corresponds to Japanese Patent Application No. 2020-567603 and is related to U.S. Appl. No. 16/952,021 with English language translation.

(Continued)

*Primary Examiner* — Steven T Sawyer
(74) *Attorney, Agent, or Firm* — Studebaker & Brackett PC

(57) ABSTRACT

The present invention provides a multilayer circuit board and a method for manufacturing the same for improving a bowing problem that occurs when manufacturing the multilayer circuit board. A multilayer circuit board according to the present invention is a board having a patterned layer that functions as a circuit a base layer, and includes: a second pattern layer formed on one side of the base layer; a first pattern layer formed on the second pattern layer; and an interlayer insulating layer formed between the first pattern layer and the second pattern layer, the interlayer insulating layer being partially formed on the second pattern layer so as to correspond to a region where the first pattern layer is formed.

6 Claims, 8 Drawing Sheets

(58) Field of Classification Search
CPC ........ H05K 3/4673; H05K 3/28; H05K 3/282; H05K 3/42; H05K 2201/0154; H05K 3/4626; H05K 3/4644; H05K 2201/09945; H05K 2201/10378

See application file for complete search history.

(56) References Cited

U.S. PATENT DOCUMENTS

| | | | | |
|---|---|---|---|---|
| 8,604,359 | B2* | 12/2013 | Chen | H05K 3/4694 |
| | | | | 174/262 |
| 2005/0057906 | A1* | 3/2005 | Nakatani | H05K 3/321 |
| | | | | 29/830 |
| 2005/0282315 | A1* | 12/2005 | Jeong | H05K 3/3436 |
| | | | | 257/E23.021 |
| 2007/0275525 | A1* | 11/2007 | Das | H01L 27/12 |
| | | | | 257/E21.008 |
| 2009/0135574 | A1* | 5/2009 | Tanaka | H01L 23/49822 |
| | | | | 156/60 |
| 2009/0217522 | A1 | 9/2009 | Ito | |
| 2012/0234589 | A1* | 9/2012 | Furuichi | H01L 23/49822 |
| | | | | 29/837 |
| 2016/0374196 | A1 | 12/2016 | Lee et al. | |
| 2017/0042026 | A1* | 2/2017 | Wu | H05K 1/111 |
| 2017/0156214 | A1* | 6/2017 | Tago | H05K 3/4617 |

FOREIGN PATENT DOCUMENTS

| | | |
|---|---|---|
| JP | 2003-298232 A | 10/2003 |
| JP | 2004-228165 A | 8/2004 |
| JP | 2005-268505 A | 9/2005 |
| JP | 2008-288612 A | 11/2008 |
| TW | 201545621 A | 12/2015 |
| WO | 2013-069763 A1 | 5/2013 |

OTHER PUBLICATIONS

Office Action issued in KR 10-2018-0083891; mailed by the Korean Intellectual Property Office dated Sep. 21, 2020.

Office Action issued in TW 108125558; mailed by the Taiwan Intellectual Property Office dated Sep. 9, 2020.

International Search Report issued in PCT/KR2019/008818; dated Nov. 12, 2019.

* cited by examiner

[FIG. 1]
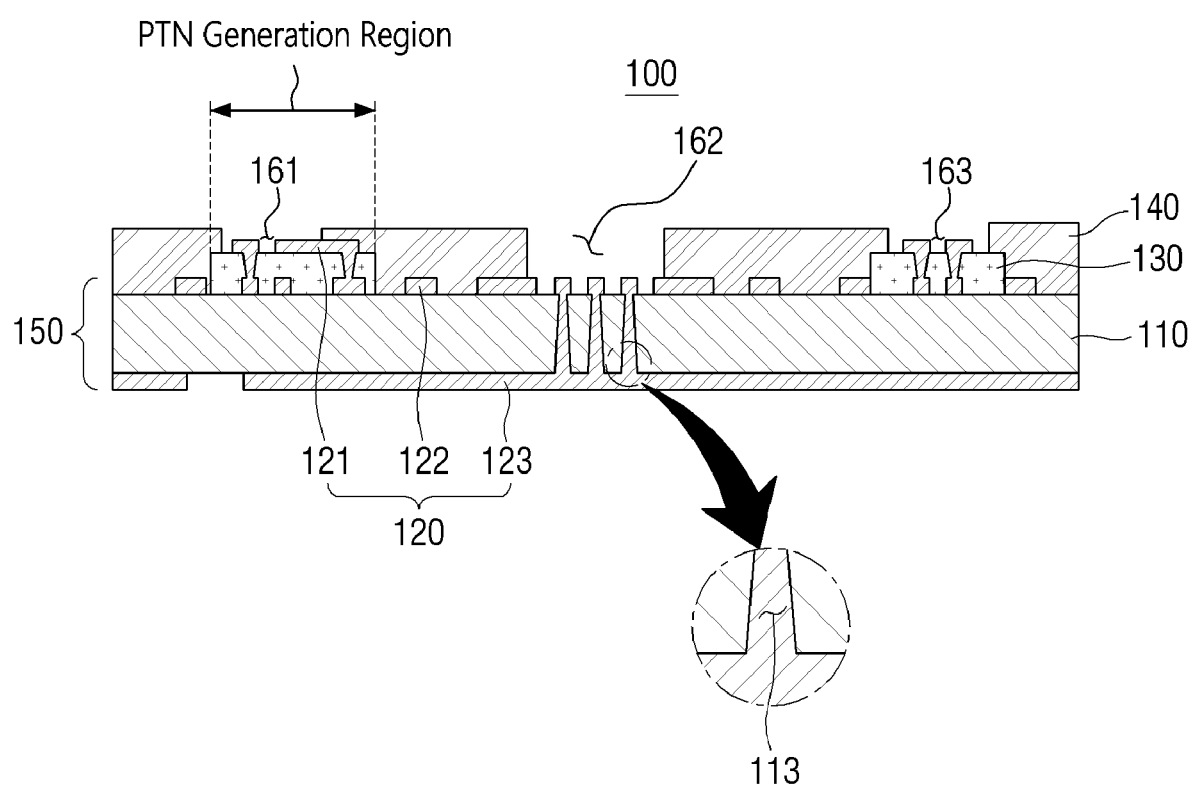

[FIG. 2A]
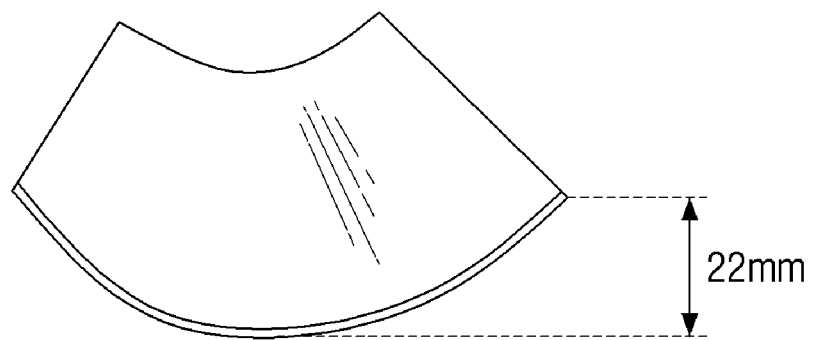
[FIG. 2B]
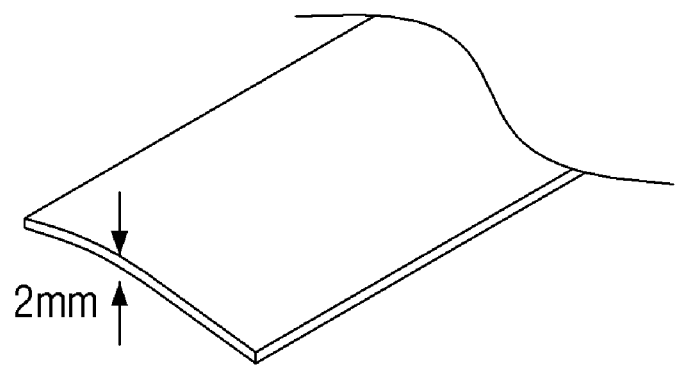

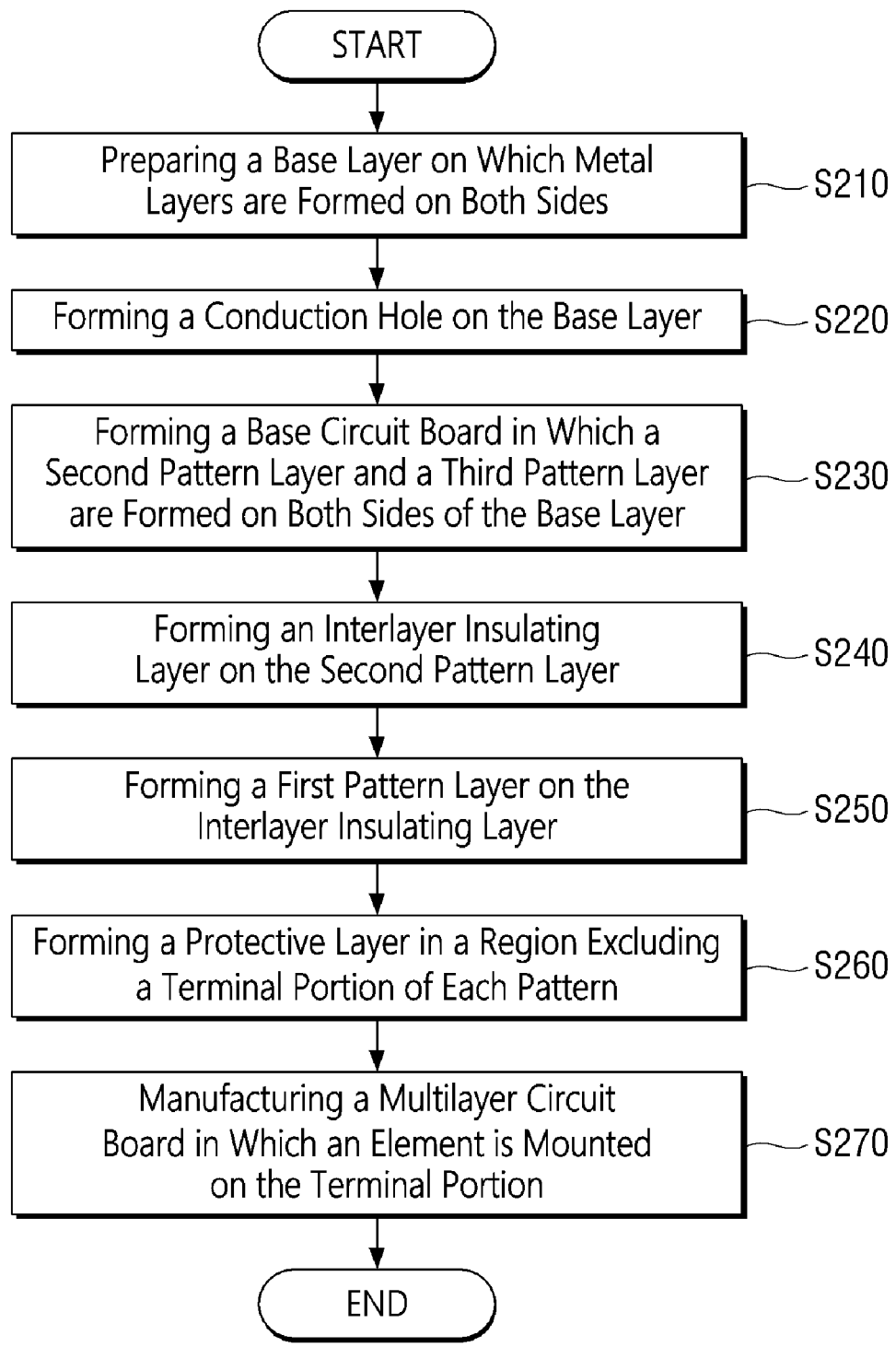

[FIG. 4]
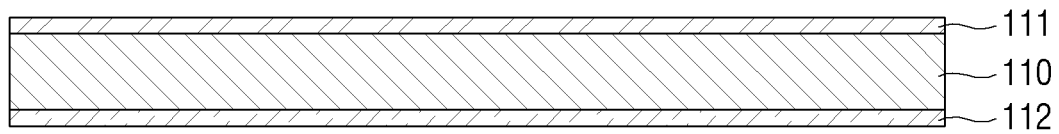
[FIG. 5]
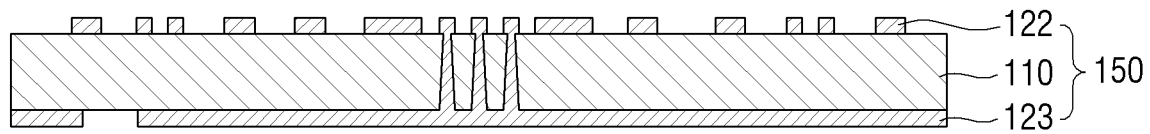
[FIG. 6]
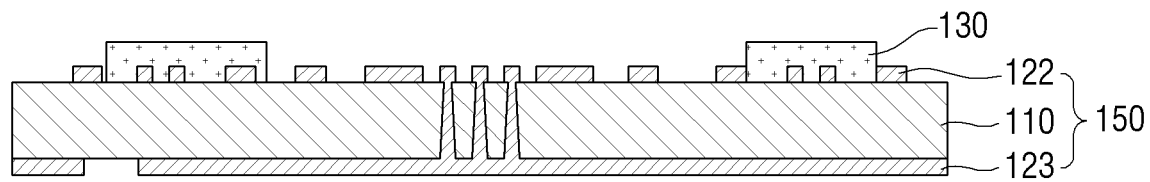

[FIG. 7]
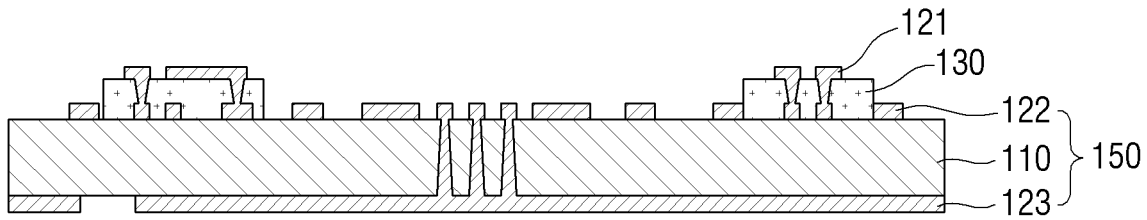
[FIG. 8]
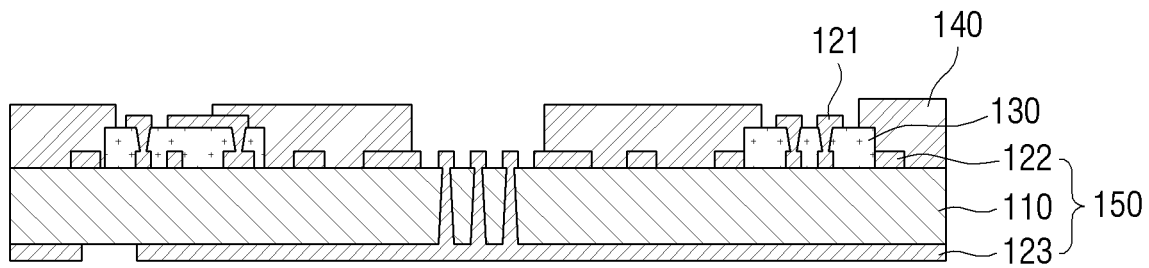
[FIG. 9]
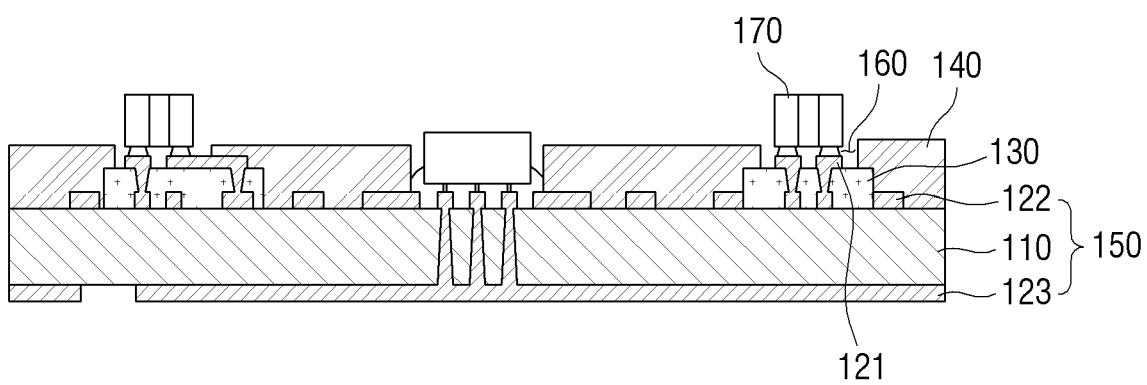

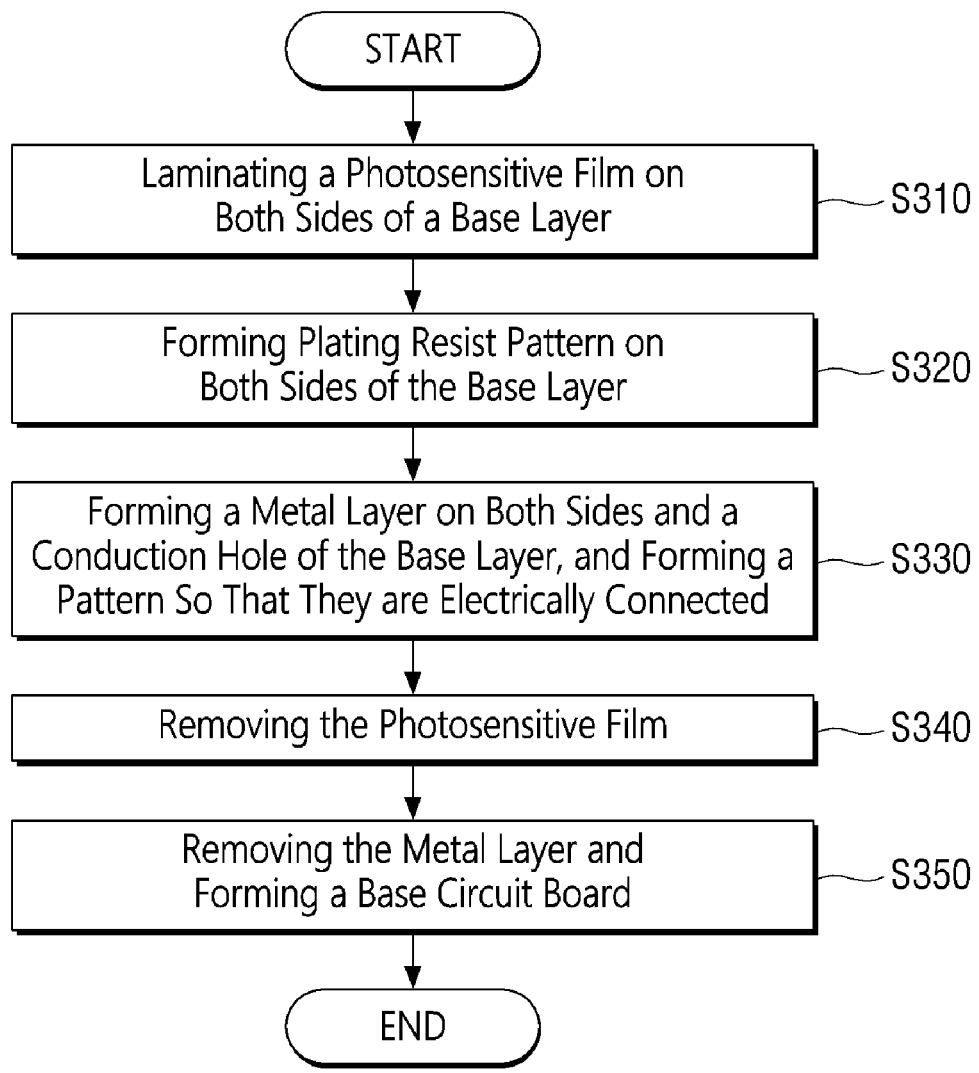
[FIG. 10]

[FIG. 11]
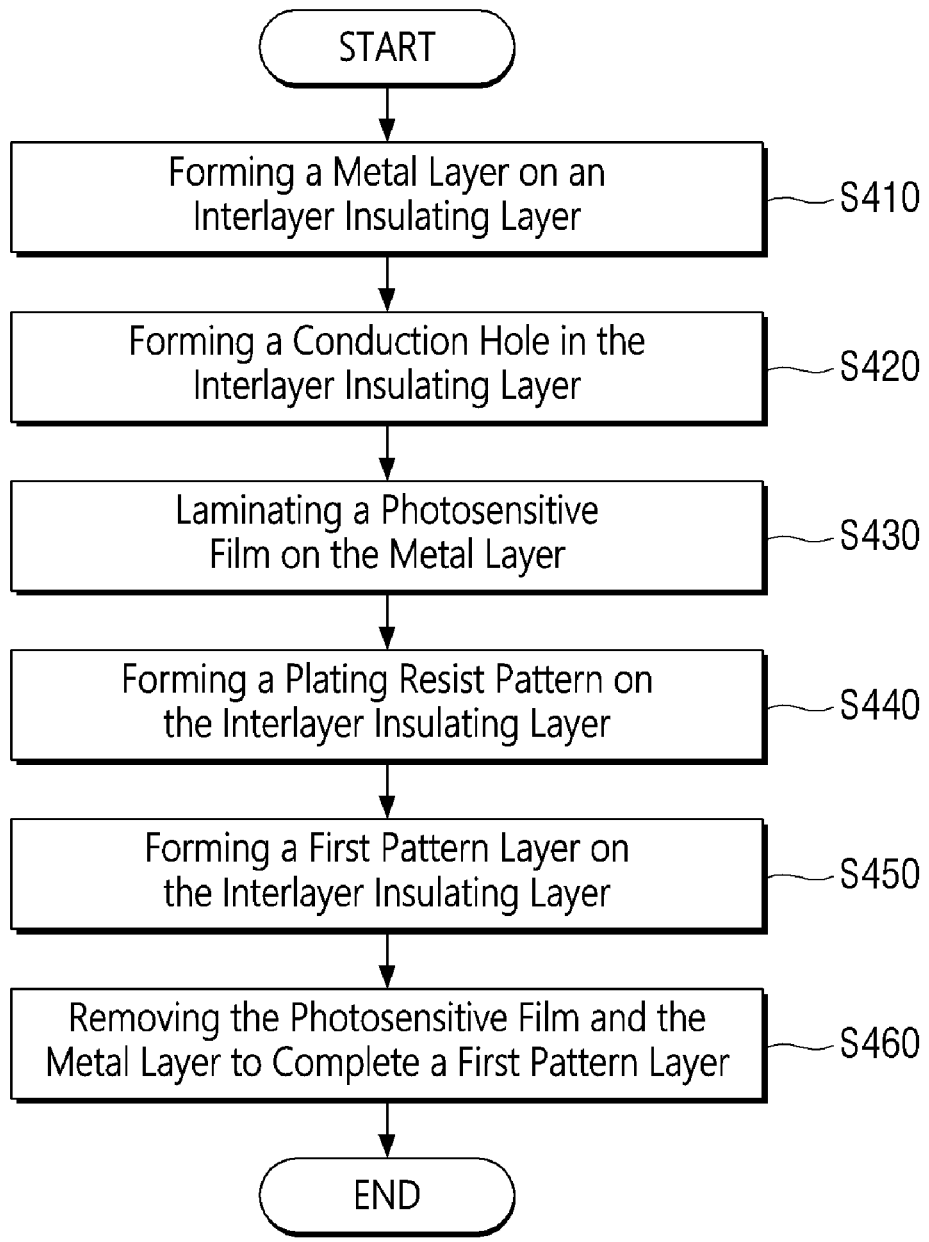

MULTILAYER CIRCUIT BOARD AND MANUFACTURING METHOD THEREFOR

CROSS-REFERENCE TO RELATED APPLICATION

The present application is a continuation of International Patent Application No. PCT/KR2019/008818, filed on Jul. 17, 2019, which is based upon and claims the benefit of priority to Korean Patent Application No. 10-2018-0083891 filed on Jul. 19, 2018. The disclosures of the above-listed applications are hereby incorporated by reference herein in their entirety.

BACKGROUND

1. Technical Field

The present invention relates to a circuit board and a method for manufacturing the same. More specifically, it relates to a multilayer circuit board and a method for manufacturing the same.

2. Description of the Related Art

A multilayer printed circuit board refers to a board in which a plurality of printed circuit boards is stacked to provide three or more layers of wiring sides. In such a multilayer printed circuit board, an interlayer insulating layer is added on a base circuit board to perform layer-up.

SUMMARY

When manufacturing a multilayer circuit board, an interlayer insulating layer added on a base circuit board is formed almost all over the base circuit board except for a connection terminal portion of the base circuit board.

However, in the multilayer circuit board in which the interlayer insulating layer is formed on the base circuit board as described above, the flatness is lowered due to a difference in stress between one side and the other side, thereby causing a bowing phenomenon. Moreover, when layer-up is continued while the number of pattern layers stacked on both sides of the base circuit board is asymmetric, these stress differences may become even greater, making the problem with the bowing even greater.

Aspects of the present invention provide a multilayer circuit board and a method for manufacturing the same for improving a bowing problem that occurs when manufacturing the multilayer circuit board.

However, aspects of the present invention are not restricted to those set forth herein. The above and other aspects of the present invention will become more apparent to one of ordinary skill in the art to which the present invention pertains by referencing the detailed description of the present invention given below.

An aspect of a multilayer circuit board of the present invention to achieve the object above includes a base layer; a second pattern layer formed on one side of the base layer; a first pattern layer formed on the second pattern layer; and an interlayer insulating layer formed between the first pattern layer and the second pattern layer, the interlayer insulating layer being partially formed on the second pattern layer so as to correspond to a region where the first pattern layer is formed.

The interlayer insulating layer may be formed in an area of 1%~50% of a total area of the base layer.

When the interlayer insulating layer is formed of at least two layers, an area of an upper interlayer insulating layer may be less than or equal to an area of a lower interlayer insulating layer.

The interlayer insulating layer is formed between two adjacent pattern layers whenever a pattern layer is added on the base layer, and may be formed corresponding to a region in which a pattern layer positioned higher among the two adjacent pattern layers is formed.

The interlayer insulating layer may be formed by printing or coating a liquid polyimide component between the two adjacent pattern layers and then curing.

The multilayer circuit board further includes a third pattern layer formed on the other side of the base layer. The third pattern layer may be electrically connected to the first pattern layer and the second pattern layer through a conduction hole formed in the base layer and a conduction hole formed in the interlayer insulating layer. The first pattern layer may be electrically connected to the second pattern layer through the conduction hole formed in the interlayer insulating layer.

The multilayer circuit board may further include a protective layer formed on a remaining region other than a terminal portion in the first pattern layer and the second pattern layer.

The first pattern layer and the second pattern layer may be formed of any one of copper, aluminum, and iron, and may be plated using any one of an etching process, an additive process, a semi additive process and a printing method.

The base layer may be formed in a film form using any one of a polyimide component, a polyester component, a polyethylene terephthalate component, a polyethylene naphthalene component, a polycarbonate component, and an epoxy component.

The multilayer circuit board may further include a stiffner stacked on a side of the base layer to reinforce the base layer.

An aspect of a method for manufacturing a multilayer circuit board of the present invention for achieving the object described above includes: forming a base circuit board by forming a second pattern layer on one side of a base layer; forming an interlayer insulating layer partially over the second pattern layer so as to correspond to a region in which a first pattern layer is to be formed; forming the first pattern layer on the interlayer insulating layer; and forming a protective layer on a remaining region other than a region of a terminal portion of the first pattern layer and the second pattern layer.

According to the method for manufacturing the multilayer circuit, a third pattern layer may be further formed on the other side of the base layer, and the method may further include forming a conduction hole in the base layer before forming the second pattern layer and the third pattern layer in the base layer.

Forming the base circuit board may include: laminating a photosensitive film (dry film resist) on both sides of the base layer; forming a plating resist pattern on both sides of the base layer; forming a metal layer in a portion exposed by the plating resist pattern on both sides of the base layer and the conduction hole of the base layer and connecting the metal layer; and forming the base circuit board having the second pattern layer and the third pattern layer on both sides of the base layer by removing the photosensitive film.

Forming the first pattern layer may include: forming a metal layer on the interlayer insulating layer; forming the conduction hole in the interlayer insulating layer; laminating the photosensitive film on the metal layer; forming a plating resist pattern with the laminated photosensitive film; forming the first pattern layer on the interlayer insulating layer using a plating method, and electrically connecting the first pattern layer and the second pattern layer through the conduction hole formed in the interlayer insulating layer and the conduction hole formed in the base layer; removing the plating resist pattern; and removing the metal layer exposed between patterns of the second pattern layer.

The method for manufacturing the multilayer circuit board may further include, after forming the protective layer, manufacturing the multilayer circuit board by mounting an element in the region of the terminal portion.

Other specific details of embodiments are included in the detailed description and drawings.

According to the present invention, the following effects may be obtained.

First, it is possible to reduce stress imbalance of a multilayer circuit board due to an interlayer insulating layer by forming the interlayer insulating layer in a required region where a pattern is stacked except for a region where the pattern is not stacked. Accordingly, it is possible to prevent the bowing problem occurring in the multilayer circuit board.

Second, when heating for stacking, a shrinkage area of the interlayer insulating layer is significantly reduced, thereby improving flatness. Accordingly, bonding of electronic components may also be improved.

Third, the amount of an insulating material used to form the interlayer insulating layer is reduced, so that raw material savings may be obtained.

BRIEF DESCRIPTION OF THE DRAWINGS

The above and other aspects and features of the present invention will become more apparent by describing in detail exemplary embodiments thereof with reference to the attached drawings, in which:

FIG. 1 is a cross-sectional view of a multilayer circuit board according to an embodiment of the present invention;

FIGS. 2A and 2B are views comparing a conventional multilayer circuit board and the multilayer circuit board of the embodiment;

FIG. 3 is a flowchart schematically illustrating a method for manufacturing a multilayer circuit board according to an embodiment of the present invention;

FIGS. 4 to 9 are reference views for explaining each step of the method for manufacturing the multilayer circuit board according to the embodiment of the present invention;

FIG. 10 is a schematic flowchart illustrating a method for forming a base circuit board according to an embodiment of the present invention;

FIG. 11 is a flowchart schematically showing a method for forming a first pattern layer according to an embodiment of the present invention.

DETAILED DESCRIPTION OF THE EMBODIMENTS

Figure 12:
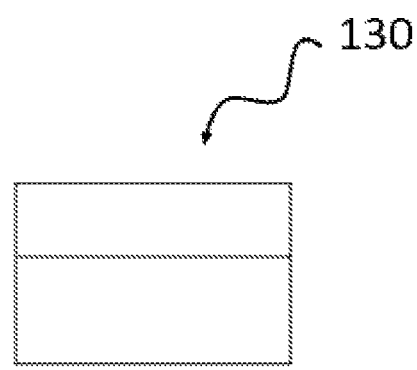
FIG. 12 is a view of an interlayer insulating layer according to an embodiment of the present invention.

Hereinafter, preferred embodiments of the present invention will be described in detail with reference to the accompanying drawings. Benefits and features of the present invention, and methods for accomplishing the same will become apparent with reference to the embodiments described below in detail in conjunction with the accompanying drawings. However, the present invention is not limited to the embodiments disclosed below, but may be implemented in various different forms. The embodiments are provided only to make the disclosure of the present invention complete, and to fully inform the scope of the invention to those skilled in the art to which the present invention pertains. The invention is only defined by the scope of the claims. Like reference numerals refer to like elements throughout the specification.

When it is referred that elements are "on" or "above" the other elements, it includes a case where other elements are interposed in the middle as well as directly above other elements. On the other hand, when it is referred that elements are "directly on" or "directly above" other elements, it indicates that there are no intervening elements or layers.

The spatially relative terms "below," "beneath," "lower," "above," "upper," or the like may be used to easily describe the correlation between one element and other elements as shown in the drawings. The spatially relative terms should be understood as terms including different directions of an element in use or operation in addition to the directions shown in the drawings. For example, if elements shown in the drawings are turned over, elements described as "below" or "beneath" of other elements may be placed "above" other elements. Accordingly, an exemplary term "below" may include both the directions below and above. Elements may also be oriented in different directions, so that the spatially relative terms may be interpreted depending on the orientation.

Although the first, second, etc. is used to describe various elements, components, and/or sections, it goes without saying that these elements, components, and/or sections are not limited by these terms. These terms are only used to distinguish one element, component, or section from other elements, components, or sections. Accordingly, it goes without saying that a first element, a first component, or a first section mentioned below may be a second element, a second component, or a second section within the technical spirit of the present invention.

The terms used herein are for the purpose of describing embodiments and are not intended to be limiting of the present invention. Herein, the singular also includes the plural unless specifically stated otherwise in the phrase. The terms "comprises" and/or "comprising" as used herein do not exclude the presence or addition of one or more other components, steps, operations, and/or elements mentioned.

Unless otherwise defined, all terms (including technical and scientific terms) used herein may be used in a sense that may be commonly understood by those of ordinary skill in the art. In addition, the terms defined in the commonly used dictionaries are not ideally or excessively interpreted unless they are specifically defined clearly.

Hereinafter, embodiments of the present invention will be described in detail with reference to the accompanying drawings. In the description with reference to the accompanying drawings, the same or corresponding components are assigned the same reference numbers regardless of drawing numbers, and redundant description thereof will be omitted.

A bowing problem not only causes a position to be shifted when mounting electronic components on a multilayer circuit board, but also becomes a factor causing a bonding failure. In addition, the Bowing problem may cause deviation when transferring products for assembly with other electronic components.

A multilayer circuit board proposed in the present invention is to improve the Bowing problem, and is characterized in that an insulating layer region is locally formed in a required region when an uppermost layer is formed. Hereinafter, the present invention will be described in detail with reference to the drawings.

FIG. 1 is a cross-sectional view of a multilayer circuit board according to an embodiment of the present invention.

Referring to FIG. 1, a multilayer circuit board 100 may include a base layer 110, a pattern layer 120, an interlayer insulating layer 130, and a protective layer 140.

The base layer 110 is a base film having a predetermined thickness and may be formed in a flat plate shape. The base layer 110 may be manufactured in the form of a film using a polyimide component as a material. However, the present embodiment is not limited thereto. For example, the base layer 110 may be made of a material (soft material) selected from a group consisting of polymer resins such as polyester components, polyethylene terephthalate components, polyethylene naphthalene components, polycarbonate components, or epoxy components as well as polyimide components.

The base layer 110 may include a stiffner (not shown) to enhance a strength of a flat plate. The stiffener may be manufactured using a polyethylene terephthalate (PET) component as a material, but the present embodiment is not limited thereto.

The stiffener may be formed by being stacked on one or both sides of the base layer 110. However, the present embodiment is not limited thereto. In other words, the stiffener may be added as a component when manufacturing the base layer 110 and mixed with the base layer 110. For example, when manufacturing the base layer 110 using a material selected from a polyimide component, a polyester component, a polyethylene naphthalene component, a polycarbonate component, an epoxy component, etc. as a material, it is also possible to manufacture the base layer 110 with improved strength by mixing a stiffener with a polyethylene terephthalate component.

The pattern layer 120 serves as a wiring function for electrically connecting electronic components, and may be mounted with an element directly or a terminal to connect to an external device. The pattern layer 120 may include a reinforcement pattern, a dummy pattern, a ground pattern, a shielding pattern, a redistribution pattern, etc. in addition to a pattern that functions as an electrical function.

The pattern layer 120 may be stacked on one or both sides of the base layer 110. When the pattern layers 120 are formed on both sides of the base layer 110, it is also possible to be configured to be electrically connected to each other through a conduction hole 113 (e.g., a through hole, a via hole, etc.) formed in the base layer 110.

The pattern layer 120 may be formed of a metal layer made of copper. However, the present embodiment is not limited thereto. For example, the pattern layer 120 may be formed of a material selected from a group consisting of metals such as aluminum, iron, or the like.

The pattern layer 120 may be plated on the base layer 110 using a conventional method for forming a circuit for manufacturing a printed circuit board. For example, the pattern layer 120 may be plated on the base layer 110 using an etching process, an additive process, a semi-additive process, a printing method (e.g., a screen printing method), or the like. The pattern layer 120 may be formed on the base layer 110 by a stacking process such as coating, lamination, or the like.

The pattern layer 120 may be formed including one or more pattern layers on both sides of the base layer 110. Here, the pattern layer 120 may be formed including the same number of pattern layers on both sides of the base layer 110.

For example, the pattern layer 120 may be formed such that a first pattern layer 121 and a second pattern layer 122 are formed on one side of the base layer 110, and a third pattern layer 123 is formed on the other side of the base layer 110, thereby including three pattern layers. The pattern layer 120 may be formed including two or more pattern layers only on one side of the base layer 110.

Considering the fact that a plurality of base layers 110 having a metal layer formed on only one side may be stacked, the pattern layer 120 may be formed including two or more Nth pattern layers (N is a natural number of 2 or more) on only one side.

When the pattern layer 120 includes three pattern layers such as the first pattern layer 121, the second pattern layer 122, and the third pattern layer 123, the pattern layer 120 may be formed on the base layer 110 in the following form.

The second pattern layer 122 may be formed on one side of the base layer 110, and the third pattern layer 123 may be formed on the other side of the base layer 110. The second pattern layer 122 and the third pattern layer 123 may be formed on both sides of the base layer 110 by laminating a photosensitive film (DFR; dry film resist) on both sides of the base layer 110, after that, forming a plating resist through exposure, development, etc., and then, plating a metal layer exposed by the plating resist.

In addition, the second pattern layer 122 and the third pattern layer 123 may be electrically connected to each other by a metal layer formed in the conduction hole of the base layer 110.

The base circuit board 150 may include the base layer 110 and the pattern layer directly formed on the base layer 110 (i.e., the second pattern layer 122 and the third pattern layer 123). The base circuit board 150 may be formed by removing the photosensitive film from both sides of the base layer 110.

The first pattern layer 121 may be formed on the second pattern layer 122. The first pattern layer 121 may be formed on the second pattern layer 122 using the interlayer insulating layer 130. In other words, the interlayer insulating layer 130 may be formed on the second pattern layer 122, and the first pattern layer 121 may be formed on the interlayer insulating layer 130.

The first pattern layer 121 may not be formed on the second pattern layer 122, but may be formed on the third pattern layer 123. In addition, the first pattern layer 121 may be formed on both the second pattern layer 122 and the third pattern layer 123.

Like the second pattern layer 122 and the third pattern layer 123, the first pattern layer 121 may be formed on the interlayer insulating layer 130 by laminating a photosensitive film on a metal layer over the interlayer insulating layer 130, forming a plating resist through exposure, development, etc., and then, using a plating method such as electrolytic plating, electroless plating, or the like.

The first pattern layer 121 may be electrically connected to the second pattern layer 122 through the conduction hole after forming a conduction hole filled with plating in the interlayer insulating layer 130. In addition, the first pattern layer 121 may be electrically connected to the third pattern layer 123 through the conduction hole formed in the interlayer insulating layer 130 and the conduction hole in the base layer 110.

In the present embodiment, it is also possible to form a metal film on the first pattern layer 121, the second pattern layer 122, the third pattern layer 123, or the like as a pattern side treatment, if necessary.

The metal film may be formed of at least one metal selected from tin, gold, chromium, or the like. However, the present embodiment is not limited thereto.

The metal film may be formed on the first pattern layer 121, the second pattern layer 122, and the third pattern layer 123 using a plating method. However, the present embodiment is not limited thereto.

The interlayer insulating layer 130 has an insulating function and may be formed of an insulator (or dielectric) as a material. The interlayer insulating layer 130 may be formed between pattern layers sequentially stacked on one side of the base layer 110, for example, between the first pattern layer 121 and the second pattern layer 122.

The interlayer insulating layer 130 may be formed over the second pattern layer 122 over the entire surface. However, in this case, a stress difference occurs between both sides of the base layer 110 and the number of layers stacked on one or both sides of the base layer 110 becomes asymmetric, and thus a bowing phenomenon may occur and intensify in the multilayer circuit board 100.

In the present embodiment, in consideration of this point, the interlayer insulating layer 130 is formed on the second pattern layer 122, but is not formed over the entire surface. It is partially formed to correspond to a region in which the pattern layer (i.e., the first pattern layer 121) is formed on the base circuit board 150 through the interlayer insulating layer 130.

In the present embodiment, even if it is on the second pattern layer 122, the interlayer insulating layer 130 is not formed in the corresponding region unless the first pattern layer 121 is formed thereon. In other words, a region where the interlayer insulating layer 130 is not formed may include a region in which a pattern that does not overlap with the first pattern layer 121 is formed on the base circuit board 150, and connection terminal regions 161, 162, 163 formed on the base circuit board 150.

The interlayer insulating layer 130 may be formed of liquid polyimide as a material. The interlayer insulating layer 130 may be formed by printing (or coating) and curing liquid polyimide between two adjacent pattern layers.

The interlayer insulating layer 130 may be formed in an area corresponding to 1% to 50% of a total area of the base layer 110. This is because if the interlayer insulating layer 130 is formed in an area of less than 1%, it is difficult to secure a space for forming another pattern layer on the interlayer insulating layer 130. In addition, this is because when the interlayer insulating layer 130 is formed in an area of more than 50% of the total area on the second pattern layer 122, a bowing phenomenon may occur due to stress imbalance.

The interlayer insulating layer 130 may be formed of a single layer, but may be formed of a plurality of layers according to design. In this case, an upper interlayer insulating layer may have the same forming area as a lower interlayer insulating layer, or may have a smaller forming area than the lower interlayer insulating layer.

The interlayer insulating layer 130 may have a conduction hole. The conduction hole of the interlayer insulating layer 130 serves to electrically connect the first pattern layer 121 and the second pattern layer 122. The conduction hole of the interlayer insulating layer 130 may be formed by using a laser, similar to the conduction hole of the base layer 110. When the interlayer insulating layer 130 is formed of a photosensitive material, it may be formed through exposure, development, or the like.

The conduction hole of the interlayer insulating layer 130 may be formed by having different sizes of one end and the other end, like the conduction hole of the base layer 110. However, the present embodiment is not limited thereto.

Although not shown, when a fourth pattern layer is formed on the third pattern layer 123, the interlayer insulating layer 130 may also be formed between the third pattern layer 123 and the fourth pattern layer thereon, as in the case of the first pattern layer 121 and the second pattern layer 122. In addition, even when a fifth pattern layer is formed on the first pattern layer 121, the interlayer insulating layer 130 may be formed between the first pattern layer 121 and the fifth pattern layer thereon. In other words, in the present embodiment, when N pattern layers are formed on one side of the base layer 110, N-1 interlayer insulating layers 130 may be provided on the side.

The protective layer 140 is for protecting the first pattern layer 121 and the second pattern layer 122, and may be formed on one side of the base layer 110 on which the first pattern layer 121, the second pattern layer 122, the interlayer insulating layer 130, etc. are formed. However, the protective layer 140 is not formed in a portion where terminals are coupled. In other words, the protective layer 140 may be formed on one side of the base layer 110 except for a region to which terminals are coupled.

The protective layer 140 may be formed of a solder resist as a material. However, in the present embodiment, a material of the protective layer 140 is not limited to a solder resist.

The protective layer 140 may be formed by printing a solder resist. However, a method for forming the protective layer 140 in the present embodiment is not limited to a printing method.

FIGS. 2A and 2B are views comparing a conventional multilayer circuit board and the multilayer circuit board of the embodiment.

A conventional asymmetric multilayer circuit board has a difference of 22 mm due to the Bowing phenomenon as shown in FIG. 2A. On the other hand, the multilayer circuit board of the present embodiment has a difference of 2 mm due to the Bowing phenomenon as shown in FIG. 2B. Therefore, it may be seen that it has been remarkably improved compared to the prior art.

Next, a method for manufacturing a multilayer circuit board according to the present embodiment will be described. FIG. 3 is a flowchart schematically illustrating a method for manufacturing a multilayer circuit board according to an embodiment of the present invention.

First, a base layer 110 on which metal layers 111 and 112 are formed on both sides is prepared (S210). The base layer 110 is as shown in FIG. 4 and may be formed of a polyimide film as a base material. Although not shown, a metal layer may be formed only on one side of the base layer 110.

The metal layers 111 and 112 formed on both sides of the base layer 110 may be formed of a copper layer. The metal layers 111 and 112 may be formed on both sides of the base layer 110 using a plating method such as electrolytic plating or electroless plating. However, the present embodiment is not limited thereto.

Thereafter, a conduction hole penetrating both sides of the base layer 110 is formed at predetermined position (S220).

Thereafter, the base circuit board 150 is formed by forming a second pattern layer 122 and a third pattern layer 123 on both sides of the base layer 110 using a circuit formation method (S230). The base circuit board 150 is as shown in FIG. 5.

In the embodiment, the base circuit board 150 may be formed in the following order. However, this is only an example, and the present embodiment is not limited thereto.

FIG. 10 is a schematic flowchart illustrating a method for forming a base circuit board according to an embodiment of the present invention. The following description refers to FIG. 10.

First, a photosensitive film (DFR) is laminated on both sides of a base layer 110 (S310).

Thereafter, plating resist patterns are formed on both sides of the base layer 110 through exposure, development, or the like (S320).

Thereafter, a metal layer is formed in a conduction hole of the base layer 110 and a portion exposed by a plating resist on both sides of the base layer 110 to form a pattern so that both sides of the base layer 110 are electrically connected to each other (S330).

In the present embodiment, the metal layer may be formed in the conduction hole of the base layer 110 and the portion exposed by the plating resist by using metal plating (e.g., copper plating). Here, electrolytic plating, electroless plating, or the like may be used as a plating method.

Thereafter, the photosensitive film is removed from both sides of the base layer 110 (S340).

Thereafter, the metal layer is removed from the remaining portions except for a portion on which the pattern are formed to complete the pattern (S350). When the pattern is completed, a second pattern layer 122 is formed on one side of the base layer 110, and a base circuit board 150 on which a third pattern layer 123 is formed is formed on the other side of the base layer 110.

The second pattern layer 122 and the third pattern layer 123 may include terminal portions for mounting an element or connecting an external device. In the present embodiment, the first pattern layer 121 may also include a terminal portion similar to the second pattern layer 122 and the third pattern layer 123.

It will be described with reference to FIG. 3 again.

When the base circuit board 150 is formed, the interlayer insulating layer 130 is formed on the second pattern layer 122 (S240). The structure in which the interlayer insulating layer 130 is formed on the base circuit board 150 is as shown in FIG. 6.

The interlayer insulating layer 130 may be formed excluding a terminal portion of the second pattern layer 122 and a circuit region in which a pattern stacked on the base circuit board 150 is not formed. In other words, the interlayer insulating layer 130 may be formed to correspond to a region in which a pattern stacked on the base circuit board 150 through the interlayer insulating layer 130 is to be formed. In the present embodiment, a pattern formed on the interlayer insulating layer 130 is the first pattern layer 121.

Thereafter, the first pattern layer 121 is formed on the interlayer insulating layer 130 (S250). The structure in which the first pattern layer 121 is formed on the interlayer insulating layer 130 is as shown in FIG. 7.

In the present embodiment, the first pattern layer 121 may be formed on the interlayer insulating layer 130 in the following order. However, this is only an example, and the present embodiment is not limited thereto.

FIG. 11 is a flowchart schematically showing a method for forming a first pattern layer according to an embodiment of the present invention. The following description refers to FIG. 11.

First, a metal layer is formed on an interlayer insulating layer 130 (S410).

Thereafter, a conduction hole is formed in the interlayer insulating layer 130 so that a second pattern layer 122 is exposed (S420).

Thereafter, a photosensitive film is laminated on the metal layer (S430).

Thereafter, a plating resist pattern is formed with the photosensitive film laminated on the interlayer insulating layer 130 through exposure, development, or the like (S440).

Thereafter, a first pattern layer 121 is formed on the interlayer insulating layer 130 using a plating method such as electrolytic plating, electroless plating, or the like (S450). Here, the conduction hole of the interlayer insulating layer 130 is also filled with plating so that the first pattern layer 121 may be electrically connected to the second pattern layer 122, a third pattern layer 123, or the like.

Thereafter, the photosensitive film on the metal layer and the plating resist pattern are removed, and the metal layer is removed from the remaining portion (e.g., a portion exposed between the patterns of the second pattern layer) excluding the patterned portion, and thus, the first pattern layer 121 is completed (S460).

It will be described with reference to FIG. 3 again.

When the first pattern layer 121 is formed on the interlayer insulating layer 130, in order to protect the first pattern layer 121 and the second pattern layer 122, the protective layer 140 is formed in a region excluding the terminal portion of each pattern (S260). The structure in which the protective layer 140 is formed on the first pattern layer 121 and the second pattern layer 122 is as illustrated in FIG. 8.

Thereafter, an element 170 is mounted on the terminal portion 160 to manufacture the multilayer circuit board 100 (S270). The multilayer circuit board 100 on which the element is mounted is as shown in FIG. 9.

The multilayer circuit board and the method for manufacturing the same according to the present embodiment have been described above with reference to FIGS. 1 to 11. The present embodiment is to improve bowing due to an asymmetric structure and heat shrinkage characteristics of an insulating layer when manufacturing a multilayer printed circuit board, and it forms an insulating layer region locally in a region required when forming the uppermost layer. In the embodiment, the following benefits may be obtained through this.

First, it is possible to reduce stress imbalance of a multilayer circuit board due to an interlayer insulating layer 130 by forming the interlayer insulating layer 130 in a required region where a pattern is stacked except for a region where the pattern is not stacked. Accordingly, it is possible to prevent the bowing problem occurring in the multilayer circuit board.

Second, when heating for stacking, a shrinkage area of the interlayer insulating layer 130 is significantly reduced, thereby improving flatness. Accordingly, bonding of electronic components may also be improved.

Third, the amount of an insulating material used to form the interlayer insulating layer 130 is reduced, so that raw material savings may be obtained.

FIG. 12 is a view of an interlayer insulating layer according to an embodiment of the present invention. In FIG. 12, the interlayer insulating layer 130 is formed of two layers.

The embodiments of the present invention have been described with reference to the accompanying drawings. However, it may be understood that those of ordinary skill in the art to which the present invention pertains may implement the present invention in other specific forms without changing its technical spirit or essential features. Therefore, it should be understood that the embodiments described above are exemplary in all respects and not restrictive.

INDUSTRIAL AVAILABILITY

The present invention may be applied to a printed circuit board.

What is claimed is:

1. A multilayer circuit board, comprising:
a base layer;
a second pattern layer formed on one side of the base layer;
a first pattern layer formed on the second pattern layer;
an interlayer insulating layer formed between the first pattern layer and the second pattern layer, the interlayer insulating layer being partially formed on the second pattern layer so as to correspond to a region in which the first pattern layer is formed;
a protective layer that covers a part of the first pattern layer which is formed on the interlayer insulating layer and is located in the uppermost layer among a plurality of pattern layers, the protective layer is integrally formed on the second pattern layer and the interlayer insulating layer,
wherein
the protective layer covers the second pattern layer on which the interlayer insulating layer is not formed, a part of the interlayer insulating layer, and a part of the first pattern layer which is formed on the interlayer insulating layer, and
the number of pattern layers which is formed on both sides of the base layer is different; and
a third pattern layer formed on the other side of the base layer,
wherein the third pattern layer is electrically connected to the first pattern layer and the second pattern layer through a conduction hole formed in the base layer and a conduction hole formed in the interlayer insulating layer, and
wherein the first pattern layer is electrically connected to the second pattern layer through the conduction hole formed in the interlayer insulating layer.

2. The board of claim 1, wherein the interlayer insulating layer is formed in an area of 1% to 50% of a total area of the base layer.

3. The board of claim 1, wherein when the interlayer insulating layer is formed of at least two or more layers, an area of an upper interlayer insulating layer is less than or equal to an area of a lower interlayer insulating layer.

4. The board of claim 1, wherein the interlayer insulating layer is formed between the first pattern layer and the second pattern layer, and is formed corresponding to a region in which the first pattern layer positioned higher among the first pattern layer and the second pattern layer is formed.

5. The board of claim 1, wherein the interlayer insulating layer is formed by printing or coating a liquid polyimide component between the two adjacent pattern layers and then curing.

6. The board of claim 1, wherein the protective layer is formed on a remaining region other than a terminal portion in the first pattern layer and the second pattern layer.

* * * * *